United States Patent
Ballance et al.

[11] Patent Number: 5,920,797
[45] Date of Patent: Jul. 6, 1999

[54] METHOD FOR GASEOUS SUBSTRATE SUPPORT

[75] Inventors: David S. Ballance, Cupertino; Benjamin Bierman, Milpitas; James V. Tietz, Fremont; Brian Haas, San Jose, all of Calif.

[73] Assignee: Applied Materials, Inc., Santa Clara, Calif.

[21] Appl. No.: 08/758,699

[22] Filed: Dec. 3, 1996

[51] Int. Cl.[6] .................................................. M01L 21/31
[52] U.S. Cl. ............................ 438/758; 438/795; 438/909
[58] Field of Search ........................... 118/728; 438/758, 438/795, 909

[56] References Cited

U.S. PATENT DOCUMENTS

| | | |
|---|---|---|
| 4,512,391 | 4/1985 | Harra . |
| 4,903,754 | 2/1990 | Hirscher ........................................ 165/1 |
| 5,445,677 | 8/1995 | Kawata et al. ............................ 118/725 |
| 5,511,608 | 4/1996 | Boyd . |
| 5,574,247 | 11/1996 | Nishitani ................................... 118/708 |
| 5,795,215 | 8/1998 | Guthrie et al. ............................ 451/286 |

FOREIGN PATENT DOCUMENTS 0 747 167 A2  12/1996  European Pat. Off. .
WO 96/41369  12/1996  WIPO .

*Primary Examiner*—John F. Niebling
*Assistant Examiner*—Michael S. Lebentritt
*Attorney, Agent, or Firm*—Fish & Richardson

[57] ABSTRACT

A method of reducing stress on a substrate in a thermal processing chamber. The method includes the steps of supporting a first portion of a substrate by means of contacting the same such that a second portion of the substrate is not contacted, part of the second portion forming one wall of a cavity, and flowing a gas into the cavity such that the pressure of the gas exerts a force on the second portion to at least partially support the second portion.

22 Claims, 5 Drawing Sheets

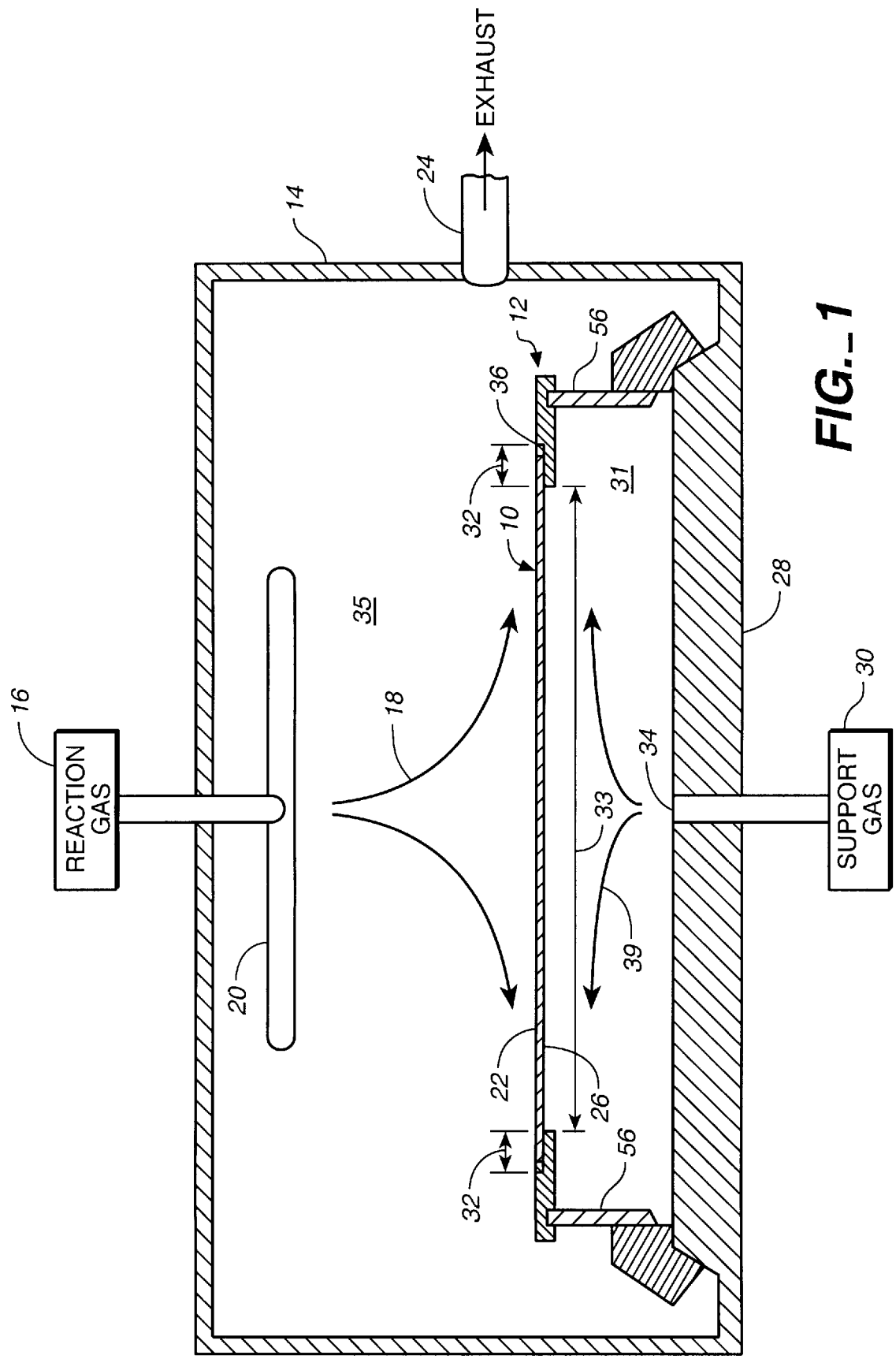
FIG._1

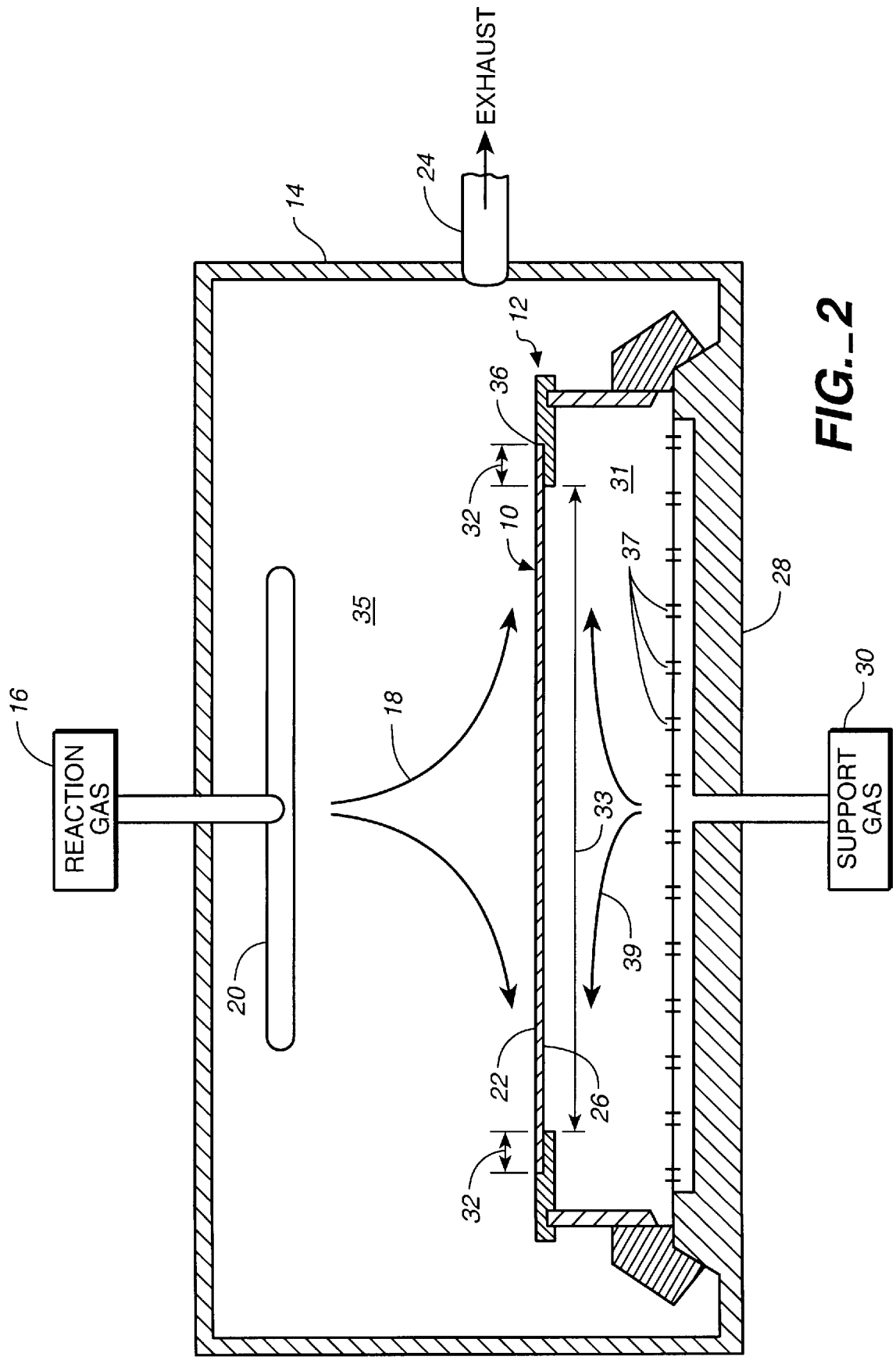
FIG._2

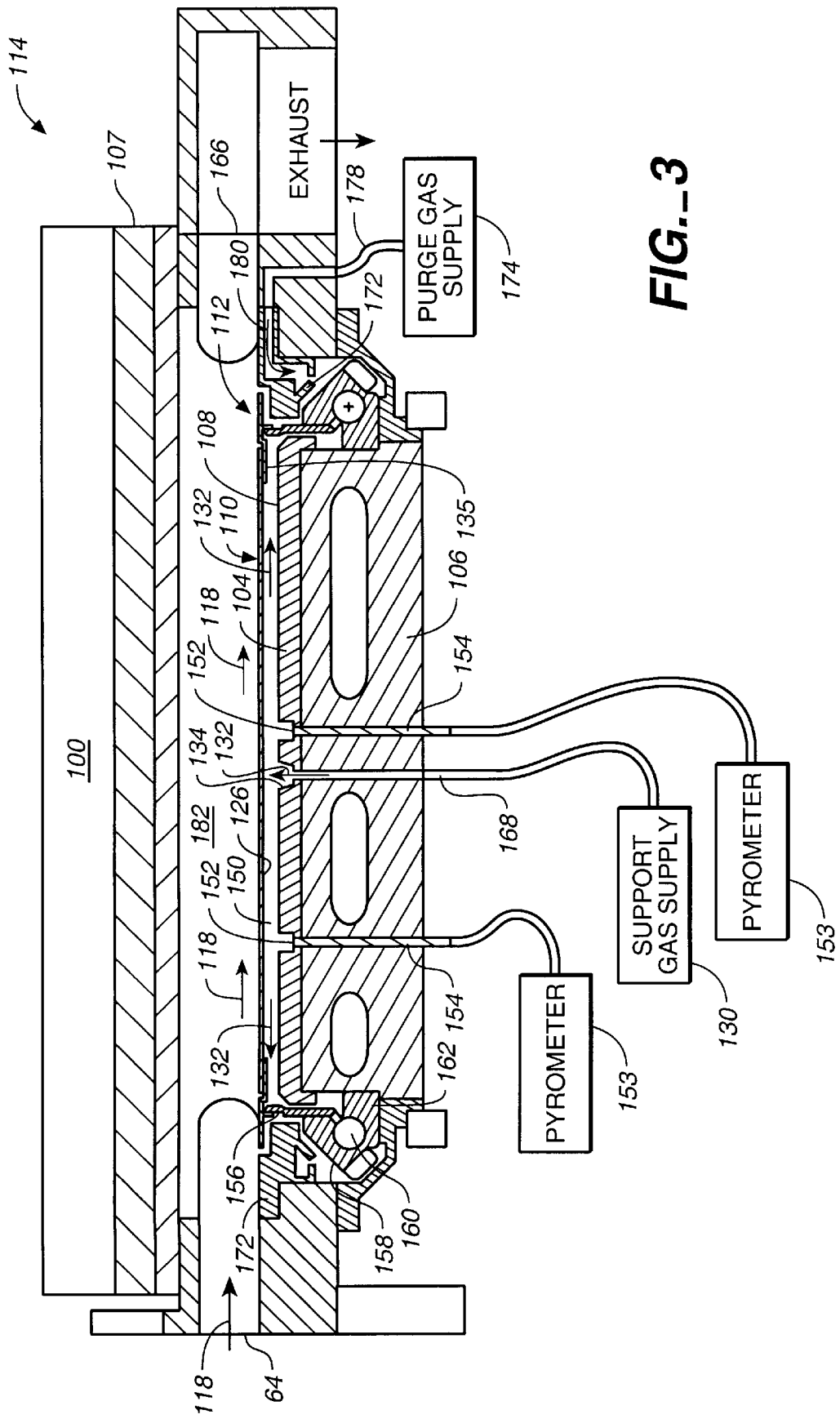
FIG._3

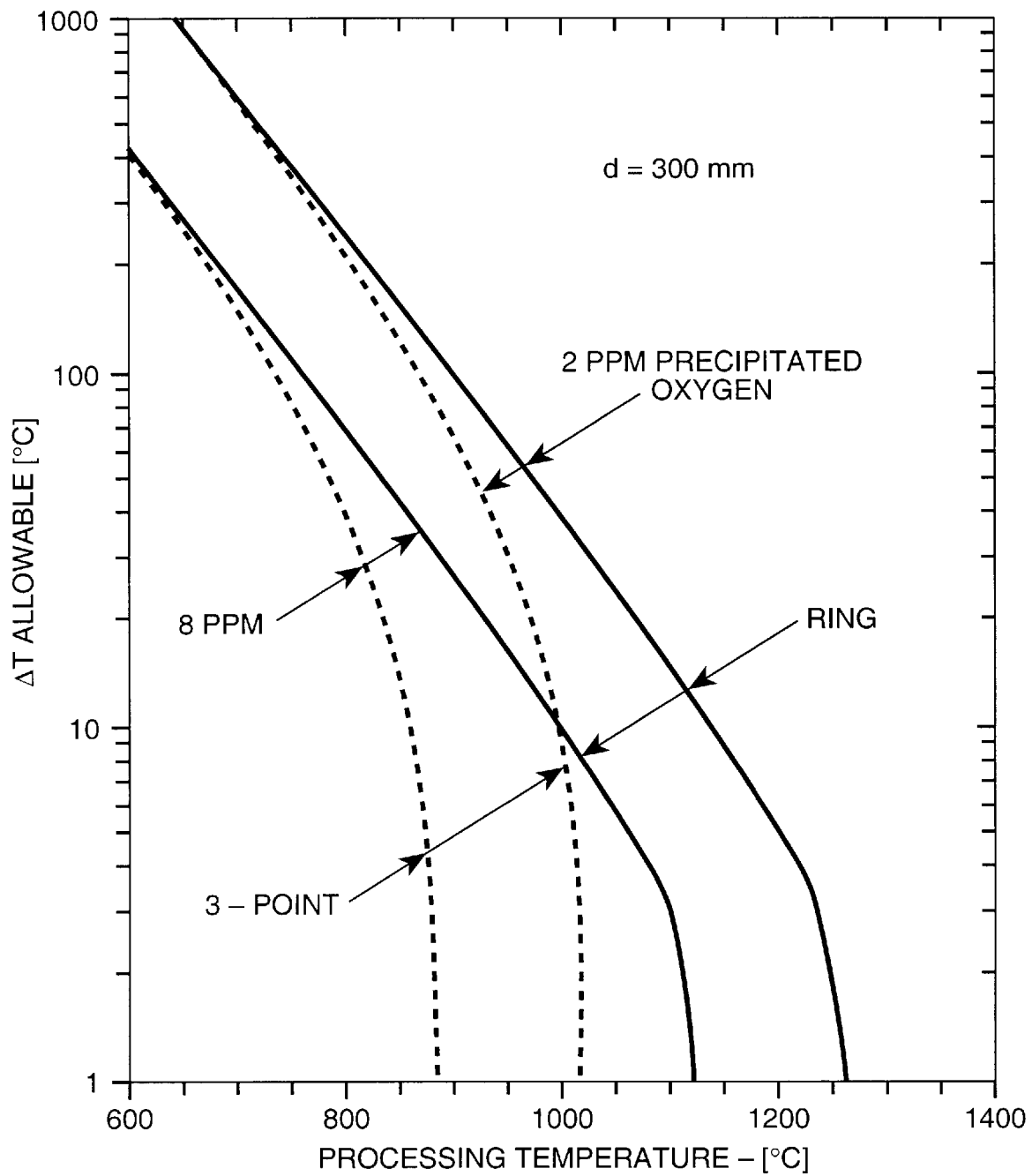
FIG._4

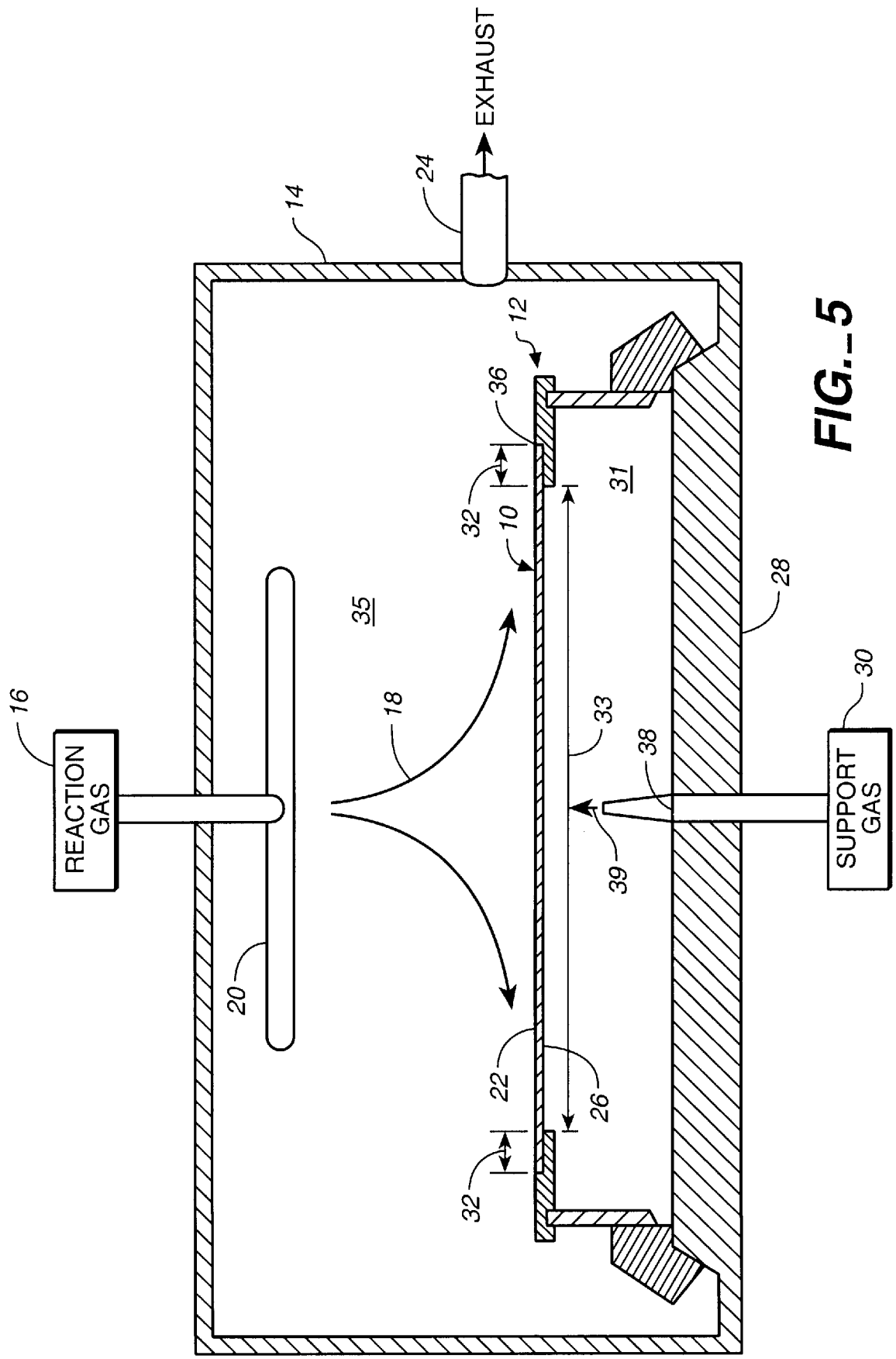
FIG._5

METHOD FOR GASEOUS SUBSTRATE SUPPORT

BACKGROUND OF THE INVENTION

The invention relates to techniques for lessening wafer slip and scratching in semiconductor processing chambers.

In many semiconductor device manufacturing processes, the required high levels of device performance, yield and process repeatability can only be achieved if the substrate (e.g., a semiconductor wafer) is not subject to large stresses during processing.

For example, consider rapid thermal processing (RTP), which is used for several different fabrication processes, including rapid thermal annealing (RTA), rapid thermal cleaning (RTC), rapid thermal chemical vapor deposition (RTCVD), rapid thermal oxidation (RTO), and rapid thermal nitridation (RTN).

There is a trend in these processes to increase substrate size so as to increase the number of devices which can be fabricated simultaneously. One type of large substrate for which processing techniques are currently being developed is a 300 millimeter (mm) diameter circular silicon (Si) wafer. The next generations of such wafers may be even larger, having diameters of 350 mm, 400 mm or even more. Of course, rectangular wafers are also used in some systems. If substrate thickness is constant, the mass of the substrate is proportional to the square of its radius or edge length. In susceptor systems, the substrate is supported by being placed on a susceptor support. Thus, the amount of support is proportional to the surface area of the substrate.

In susceptorless systems, the substrate is usually only mechanically supported around its perimeter. The amount of support in this type of system is only proportional to the diameter of the substrate (the edge length for a rectangular substrate), not the area as in a susceptor system. In these systems, as substrates get larger, they tend to sag where they are not supported, i.e., in areas away from the perimeter support.

In particular, gravity causes stress in the substrate. This gravitational stress results in a strain which is evidenced by sagging. Strain can damage the substrate by causing wafer slip in the silicon crystal. This wafer slip will usually destroy devices through which they pass.

Another potential cause of stress are radial temperature gradients. These occur when the center of the substrate is at a different temperature than the edge. Such radial temperature gradients typically occur when the substrate is heated or cooled rapidly, as the rate of heat loss is usually different at the center than at the edge. Thus, radial temperature gradients occur most frequently in rapid thermal processes.

Both causes of stress, gravity and radial temperature gradients, affect the maximum temperature to which a substrate may be brought without wafer slippage. For example, consider a large wafer that is perfectly conductive and thus has no radial temperature gradients. If this wafer is only supported around its perimeter, and is thus subject to substantial gravitational stress, the wafer's maximum processing temperature is lower than if no gravitational stress is present. Similarly, if a small wafer, otherwise not subject to large gravitational stresses, is caused to have a large temperature gradient, the wafer's maximum processing temperature is lower than if no temperature gradients were present.

Substrates in rapid thermal processing chambers may be required to withstand maximum processing temperatures of, for example, 1250° C. If stress is present, this maximum processing temperature is lowered. Thus, to maintain high maximum processing temperatures, it is important to minimize the causes of stress.

It has been modeled that the gravitationally induced stress is equivalent to a center-to-edge radial temperature difference of approximately 3° C. for a 300 mm wafer. However, the impact of the stress on the maximum processing temperature is generally more significant, on the order of fifty to a hundred degrees Celsius.

It is an object of the invention to provide a susceptorless method of supporting substrates that produces less stress in the substrate. It is a further object to provide a substrate support method that causes less wafer slip and less scratching to be produced in the substrate than prior methods.

Additional objects and advantages of the invention will be set forth in the description which follows, and in part will be obvious from the description, or may be learned by practice of the invention. The objects and advantages of the invention may be realized and obtained by means of the instrumentalities and combinations particularly pointed out in the claims.

SUMMARY OF INVENTION

In one embodiment, the invention is directed to a method of reducing stress on a substrate in a thermal processing chamber. The method includes the steps of supporting a first portion of a substrate by means of contacting the same such that a second portion of the substrate is not contacted, part of the second portion forming one wall of a cavity, and flowing a gas into the cavity such that the pressure of the gas exerts a force on the second portion to at least partially support the second portion.

Implementations of the invention include the following. The supporting step is performed by an annular support, such that the first portion of the substrate is contacted by the annular support. The second portion can be the backside of the substrate except for the first portion. The annular support can be an annular edge ring. The thermal processing chamber can be a chemical vapor deposition apparatus. Another step is heating the gas. The gas flow can be controlled by a closed-loop or open-loop feedback system. The force exerted by the gas can be about one-third to two-thirds of the weight of the substrate. The flowing gas can enter the cavity through a nozzle or an air plenum at a rate of between about three to five liters per minute. The pressure differential between the cavity and the remainder of the chamber in a range of between about 50 millitorr and about 200 millitorr, for example about 100 millitorr. Another step can be setting a predetermined support force for the substrate, such that the predetermined support force for the substrate is approximately equal to a pressure differential between the cavity and the remainder of the chamber times the area of the part of the second portion.

In another embodiment, the invention is directed to a method of reducing backside scratching and damage to a substrate in a thermal processing chamber. The method includes the steps of supporting a first portion of a substrate by means of contacting the same such that a second portion of the substrate is not contacted, part of the second portion forming one wall of a cavity, and flowing a gas into the cavity such that the pressure of the gas exerts a force on the second portion to at least partially support the second portion.

In another embodiment, the invention is directed to a method of reducing stress on a substrate in a thermal processing chamber. The method includes the steps of supporting a first portion of a substrate by means of contacting the same such that a second portion of the substrate is not contacted, part of the second portion forming one wall of a cavity, and flowing a gas into the cavity such that the force of the gas on the second portion at least partially supports the second portion.

Implementations of the invention include the following. The gas impacts the substrate at or near the center of the substrate. Another step can be heating the gas before the step of flowing the gas into the cavity.

Among the advantages of the invention are the following. It is an advantage of the invention that substrates in thermal processing chambers suffer fewer dislocations than in previous methods because the substrates are more evenly supported. Substrates can be brought to high temperatures without the onset of dislocations and slippage. Substrates are more robust and have a higher tolerance with respect to high temperatures and high temperature gradients than in previous support methods. It is yet a further advantage that the overall weight of the substrate on the edge ring is lessened, reducing the probability of the edge ring damaging the substrate.

BRIEF DESCRIPTION OF THE DRAWINGS

The accompanying drawings, which are incorporated in and constitute a part of the specification, schematically illustrate the invention and, together with the general description given above and the detailed description given below, serve to explain the principles of the invention.

FIG. 1 is a diagrammatic cross-sectional side view of an RTP system using a gaseous substrate support.

FIG. 2 is a diagrammatic cross-sectional side view of another embodiment of an RTP system using a gaseous substrate support where the gas is provided through an air plenum.

FIG. 3 is a more detailed cross-sectional side view of another embodiment of an RTP system according to the invention using a gaseous substrate support.

FIG. 4 is a graph showing the allowable temperature gradient as a function of processing temperature.

FIG. 5 is a diagrammatic cross-sectional side view of another embodiment of an RTP system using a gaseous substrate support where the gas is provided through a nozzle.

DETAILED DESCRIPTION

In the following description, we refer to a "substrate". This is intended to broadly cover any object that is being processed in a thermal processing chamber. The term "substrate" includes, for example, semiconductor wafers, flat panel displays, glass plates or disks, and plastic workpieces. In this description, reference is made to a 300 mm wafer. However, the invention is also applicable to wafers having either larger or smaller diameters, and is particularly applicable to wafers having a size sufficient to induce gravitational sagging.

A simple diagram of an embodiment of an RTP system incorporating the invention is shown in FIG. 1. In FIG. 1, an RTP chamber 14 is shown having a base 28. Base 28 is underneath a substrate 10. Substrate 10 has a top side 22 and a bottom side 26. Substrate 10 is supported by an edge ring 36 mounted on a rotating support 12. Specifically, edge ring 36 mechanically supports the substrate by contacting an annular first portion 32 of substrate 10, while a second portion 33 of substrate 10, in this embodiment the remainder of the substrate, is left uncontacted. Internal cavity 31 is formed by the bottom side 26 of substrate 10, a cylindrical wall portion 56 of support 12, and base 28. While an annular edge ring is shown, the invention may also be used with other types of susceptorless supports.

Reaction gases 18 enter the chamber from a reaction gas supply 16 through an air plenum 20. Air plenum 20 may, for example, have a number of ports or nozzles through which reaction gases 18 emerge. These reaction gases provide reactants which may be used to thermally treat substrate 10. The thermal treatments envisioned include, among others, annealing, deposition, diffusion, oxidation, and reduction. These gases or the gases from the reaction products are removed through exhaust port 24.

According to an embodiment of the present invention, a support gas supply 30 may be provided which supplies a gas 39 to internal cavity 31 through input port 34. Chamber 14 is thus divided into two sections: internal cavity 31 and a reaction zone or processing volume 35. Most of the latter volume is located generally above substrate 10. Input port 34 is shown in FIG. 1 as a small input passageway. Input port 34 may also have a cross-flow injection design (not illustrated), also referred to as a horizontal showerhead, so that gas 39 emerges in a direction parallel to the substrate so as not to result in local cooling effects.

Input port 34 may alternatively include a perforated disk or air plenum mounted to base 28. Alternatively, a valve (not illustrated) may be employed in port 34 to supply gas to cavity 31. A gas plenum system is shown in FIG. 2, where multiple ports 37 supply gases 32.

By providing gases to internal cavity 31, gas pressure is built-up and is used to at least partially support substrate 10 at second portion 33.

The system of the invention will now be described in more detail.

A more detailed RTP system according to another embodiment of the invention is shown in FIG. 3. This system is more fully described in U.S. Pat. No. 5,660,472 entitled "Method and Apparatus for Measuring Substrate Temperatures", assigned to the assignee of the present application, and herein incorporated by reference.

The RTP system includes a processing chamber 114 for processing a substrate 110 such as a disk-shaped, 300 mm diameter silicon wafer. The substrate 110 is mounted inside the chamber on a substrate support structure 112 and more particularly by an edge ring 135 mounted on support 112. The substrate is heated by a heating element 100 located directly above the substrate. The heating element 100 generates radiation which enters the processing chamber 114 through a water-cooled quartz window assembly 107 which may be approximately one inch (2.5 cm) above the substrate.

Reaction gases 118 enter processing volume 182 through port 64, react with substrate 110, and are exhausted by exhaust system 166. It is noted that reaction gases 118 may, however, enter from any suitable port on the body of the chamber.

Beneath substrate 110 is a reflector 104 which is mounted on a water-cooled, stainless steel base 106. Reflector 104 may be made of aluminum and has a highly reflective surface coating 108. The bottom side 126 of substrate 110, the top of reflector 104, and the walls of support structure 112 form a reflecting cavity 150 for enhancing the effective emissivity of the substrate.

The separation between the substrate and reflector may be approximately 0.3 inch (7.6 mm), thus forming cavity 150 which has a width-to-height ratio of about 27. In processing systems that are designed for 300 mm silicon wafers, the distance between the substrate 110 and reflector 104 may be between about 5 mm and 30 mm, and preferably between 5 mm and 25 mm.

The temperatures at localized regions of substrate 110 are measured by a plurality of pyrometers 153 (only two of which are shown in FIG. 3). These pyrometers 153 include sapphire light pipes that pass through a conduit 154. Conduit 154 extends from the backside of base 106 through the top of reflector 104 through windows 152.

During thermal processing, support structure 108 is rotated at about 90 RPM. The support structure which rotates the substrate includes, as noted, edge ring 135. The edge ring contacts the substrate around a first portion including the substrate's outer perimeter, thereby leaving a second portion of the underside of the substrate exposed except for a small annular region about the outer perimeter. Edge ring 135 includes a depressed pocket portion for contacting and supporting the substrate. The pocket portion may constitute a ledge with a width of approximately 4 mm. To minimize the thermal discontinuities that occur at the edge of substrate 110 during processing, edge ring 135 is made of the same, or similar, material as the substrate, e.g. silicon or silicon carbide.

As noted, edge ring 135 is supported by support structure 112. More particularly, edge ring 135 rest on a rotatable quartz cylinder 156 of support structure 112. The cylinder 156 is coated with a material such as silicon to render it opaque in the frequency range of the pyrometers. Other opaque materials may also be used. The bottom of the quartz cylinder is held by an annular upper bearing race 158 which rests on a plurality of ball bearings 160 that are, in turn, held within a stationary, annular, lower bearing race 162. The ball bearings 160 may be made of steel and coated with silicon nitride to reduce particulate formation during operation. Upper bearing race 158 is magnetically-coupled to an actuator (not shown) which rotates cylinder 156, edge ring 135 and substrate 110 during thermal processing.

A purge ring 172 that is fitted into the chamber body surrounds the quartz cylinder 156. Purge ring 172 has an internal annular cavity 180 which opens up to a region above upper bearing race 158. Internal annular cavity 180 is connected to a purge gas supply 174 through a passageway 178. During processing, a purge gas may be flowed into the chamber through purge ring 172, as the process requires. For example, such purge gases may be used to flush the chamber or to prevent reaction gases from entering areas in which they are undesired. Such gases may be exhausted by, for example, exhaust system 166.

As the edge ring only contacts substrate 110 around its perimeter, the remainder of substrate 110 is uncontacted. If substrate 110 is a large wafer, say 300 mm in diameter, the effects of gravity may cause the uncontacted sections of substrate 110 to sag a substantial amount. For example, sags of 150 microns have been noted for a 300 mm wafer at room temperature. As discussed above, this results in a lower maximum processing temperature as well as a lessened robustness with respect to temperature gradients.

FIG. 4 demonstrates this behavior. In particular, the allowable temperature gradient ΔT Allowable [°C.] (above which wafer slippage occurs) is plotted on the y-axis and the processing temperature [°C.] is plotted on the x-axis. The dotted lines indicate the behavior for a three-point support. The solid lines indicate the behavior for an annular edge ring, the annular support structure described above. For each of these two sets of curves, the curve on the left indicates the allowable temperature gradient for a substrate whose crystal lattice includes 8 parts per million (ppm) precipitated oxygen. The curve on the right shows the behavior for a substrate having 2 ppm precipitated oxygen.

The negative slope of the curves shows that the allowable temperature gradient ΔT [°C.] decreases as the processing temperature [°C.] of the substrate rises. At a gradient of about 3° C., the temperature to which the substrate may be safely heated without slippage drops dramatically. The reason for this precipitous drop is gravity and the effects of sagging.

It is also evident from the graph that the allowable temperature gradient drops as the amount of precipitated oxygen rises. Furthermore, for a three-point support, as indicated by the dotted lines, the substrate cannot even achieve a common processing temperature of 1025° C. without slippage.

The present invention inhibits dislocations such as wafer slip by supporting the mechanically uncontacted second portion of the substrate with gas pressure. Support gas 132 is supplied to cavity 150 through gas line 168 from a support gas supply 130 in a controlled manner through input port 134, which may generally be any of the types of gas distribution systems noted above in connection with input port 34. By controlling the gas supply to cavity 150, the pressure within this cavity can be controlled. A pressure differential range (from cavity 150 to processing volume 182) which may be advantageously used is 0.05 torr to 0.2 torr and especially 0.1 torr, but generally depends on factors such as the weight of the substrate. As mentioned above, for 300 mm substrates, a pressure differential which may be used is about 0.1 torr, i.e., the pressure within cavity 150 may be 0.1 torr higher than the pressure in a processing volume 182 which constitutes the remainder of chamber 114, which is generally that portion of the chamber above substrate 110 and support structure 112. If the pressure in chamber 114 is ambient or atmospheric, its pressure measures about 760 torr. In this case, a suitable pressure within cavity 150 may be about 760.1 torr.

It should be noted that the gas pressure built-up within cavity 150 is accomplished without special seals, although such seals may be used if fine pressure control is required. The gas generally exits cavity 150 through the bearing 160 and race 162 system of cylinder 156. In the system described, this gas conductance path is circuitous and allows a pressure differential to be built-up.

Of course, a very wide range of pressures may be used within cavity 150, and these are in part dependent on the pressure in processing volume 182. Other factors influencing the pressure chosen for cavity 150 include the type of material constituting the substrate, the desired support for the substrate, the weight of the substrate, and the extent to which dislocations are undesirable. For example, depending on the purposes to which the substrate is to be put, it may be desirable to lift one-third to two-thirds of the weight of the substrate off of the edge ring using the support gas pressure. The pressure gradient range (from cavity 150 to processing volume 182) which may be used generally depends on the gas conductance.

The present invention may require a high flow rate for the support gas so that the same can support the substrate. Values of gas flow which may be used have been found to be on the order of 3–5 liters per minute. These rates are useful in the bearing system described above. However, greater or lesser flow rates may be used depending on the requirements of the process, the hardware design details, and the conductance of the gas exit path. In processes which may additionally employ a backside purge so as to eliminate backside deposition, a backside purge being described in U.S. patent application Ser. No. 08/687,166, for a "Method and Apparatus for Purging the Back Side of a Substrate During Chemical Vapor Processing", filed Jul. 24, 1996 by J. V. Tietz, B. Bierman, and D. S. Ballance, assigned to the assignee of the present invention, and herein incorporated by reference, the requirements of the backside purge and those of the support gas may generally be reconciled to achieve a gas pressure appropriate for both. Such processes employing a backside purge include chemical vapor deposition, oxidation and nitrogen implant anneals.

The gas within cavity 150 provides a support force to substrate 110 with a force equal to the gas pressure times the area of the part of substrate 110 which it contacts, in this case, the circular bottom side of the substrate except for that part supported by the annular edge ring. The gaseous support for substrate 110 may be chosen so as to inhibit wafer slip.

In this embodiment, it should be noted that the position of input port 134 is immaterial. While FIGS. 1–3 and 5 (discussed below) show the input port roughly in a position in-line with the center of the substrate, the input port can be located anywhere in base 106. In certain applications, however, it may be desired to place the port away from the perimeter of the wafer.

It is often important to ensure that the gaseous support for the wafer is not so great that the wafer slides or skips on the edge ring during rotation. One way of ensuring this is to rotationally accelerate the wafer in an appropriate nonlinear fashion. For example, if the wafer backside contacts the edge ring with a low value of friction, it may be necessary to use a low radial acceleration in bringing the wafer up to operating speed. In any case, the upper limit for the gaseous support for the wafer is often dictated by the sliding of the wafer on the edge ring.

In the above embodiment, either open or closed-loop control may be used to control the pressure in cavity 150.

In open-loop control, for example, empirical data can be used to determine how much gas flow is required to support the substrate a desired amount. This gas flow rate, usually on the order of liters per minute but measured in standard cubic centimeters per minute (sccm), is controlled by a regulator (not shown) on support gas supply 130. Of course, the regulator may also be located anywhere between the support gas supply 130 and input port 134.

In closed-loop control, the gas pressure is sensed y a sensor (not shown) which may be located in cavity 150. This pressure is fed back to a control circuit or program that adjusts the gas flow using an automatic control valve at support gas supply 130 so as to maintain the pressure at a predetermined value. As before, the automatic control valve could also be located anywhere between the support gas supply 130 and input port 134.

In another embodiment, the position and design of the input port are more important. In this embodiment, as indicated in FIG. 5, the momentum of gas particles 32 emerging from the input port is used to provide a support to the substrate. In particular, the input port is a nozzle 38, and gas particles 32 emerge from the nozzle with a substantial velocity. They strike the backside 26 of the substrate 10 and transfer their momentum to it. By conservation of momentum, this imparts an upward force to substrate 10. This support gas can be pre-heated so that the substrate is not cooled by the impinging gas. A gas heater (not shown) in this embodiment may be located anywhere in the line between gas supply 30 and nozzle 38.

In this embodiment, for example, gas nozzle 38 may be any type of nozzled valve by which gas particles may be provided with a relatively high velocity. Nozzle 38 may be located at or near a position in-line with the center of the substrate 10. Of course, a plurality of nozzles 38 could also be used to support substrate 10 in different locations. For example, three nozzles located at the same radial distance from the center of substrate 10 and spaced 120° apart could be employed so long as the amount of gas flow were the same for each. Of course, each of the embodiments described above could be implemented using multiple input ports or nozzles. Alternative designs could be used, with the basic requirement of such systems being that the substrate not be overly tipped to any one side such that the support gas escapes from cavity 31.

In all of the above embodiments, the weight of the substrate on the edge ring is partially lifted. This provides an additional benefit because the substrate is less likely to suffer damage from the edge ring as the force between them is lessened by an amount equal to the force provided by the gas in the cavity. This results in a reduced amount of friction between the two, and thus less damage. Of course, this aspect of the invention is advantageous for wafers of all sizes, not just large wafers. For example, a 200 mm wafer may benefit from such relief from scratching.

The present invention has been described in terms of preferred embodiments. The invention, however, is not limited to the embodiments depicted and described. Rather, the scope of the invention is defined by the appended claims.

What is claimed is:

1. A method of reducing stress on a substrate in a thermal processing chamber, the substrate having a top side and a back side, said method comprising the steps of:

supporting a first portion of the back side of the substrate on a substrate support inside the thermal processing chamber, wherein an unsupported second portion of the back side of the substrate together with the substrate support defines a boundary of a cavity, and the top side of the substrate is exposed for contact with ambient processing conditions inside the thermal processing chamber;

flowing a gas into said cavity such that the pressure of the gas exerts a force on said second portion of the back side of the substrate to at least partially support said second portion.

2. The method of claim 1, wherein said supporting step is performed by an annular support, such that said first portion of said substrate is contacted by said annular support.

3. The method of claim 2, wherein said second portion is the backside of the substrate except for the first portion.

4. The method of claim 2, wherein said annular support is an annular edge ring.

5. The method of claim 1, wherein said thermal processing chamber is a chemical vapor deposition apparatus.

6. The method of claim 1, further comprising the step of heating the gas.

7. The method of claim 1, further comprising the step of controlling the gas flow by a closed-loop feedback system.

8. The method of claim 1, further comprising the step of controlling the gas flow by an open-loop feedback system.

9. The method of claim 1 wherein the force exerted by the gas is about one-third to two-thirds of the weight of said substrate.

10. The method of claim 1, wherein the flowing gas enters the cavity through a nozzle.

11. The method of claim 1, wherein the flowing gas enters the cavity through an air plenum.

12. The method of claim 1, wherein the flowing gas enters the cavity at a rate of between about three to five liters per minute.

13. The method of claim 1, wherein there is a pressure differential between said cavity and the remainder of said chamber in a range of between about 50 millitorr and about 200 millitorr.

14. The method of claim 13, wherein the pressure differential between said cavity and the remainder of said chamber is about 100 millitorr.

15. The method of claim 1, further comprising the step of:

setting a predetermined support force for said substrate, such that the predetermined support force for said substrate is approximately equal to a pressure differential between said cavity and the remainder of said chamber times the area of said part of said second portion.

16. A method of reducing back side scratching and damage to a substrate in a thermal processing chamber, the substrate having a top side and a back side, said method comprising the steps of:

supporting a first portion of the back side of the substrate on a substrate support inside the thermal processing chamber, wherein an unsupported second portion of the back side of the substrate together with the substrate support defines a boundary of a cavity, and the top side of the substrate is exposed for contact with ambient processing conditions inside the thermal processing chamber;

flowing a gas into said cavity such that the pressure of the gas exerts a force on said second portion of the back side of the substrate to at least partially support said second portion.

17. A method of reducing stress on a substrate in a thermal processing chamber, the substrate having a top side and a back side, said method comprising the steps of:

supporting a first portion of the back side of the substrate on a substrate support inside the thermal processing chamber, wherein an unsupported second portion of the back side of the substrate together with the substrate support defines a boundary of a cavity, and the top side of the substrate is exposed for contact with ambient processing conditions inside the thermal processing chamber;

flowing a gas into said cavity such that the force of the gas on said second portion of the back side of the substrate to at least partially support said second portion.

18. The method of claim 17, wherein the gas impacts said substrate at or near the center of said substrate.

19. The method of claim 17, further comprising the step of heating the gas before the step of flowing the gas into said cavity.

20. The method of claim 1, wherein only the back side of the substrate contacts the substrate support.

21. The method of claim 1, wherein the substrate is substantially free to move relative to the substrate support in response to the at least partial support provided by the force exerted by the flowing gas.

22. The method of claim 1, further comprising reducing the pressure inside the processing chamber such that the top side of the substrate is exposed for contact with sub-atmospheric processing conditions.

* * * * *